United States Patent
Voldman et al.

(10) Patent No.: US 6,600,199 B2
(45) Date of Patent: Jul. 29, 2003

(54) DEEP TRENCH-BURIED LAYER ARRAY AND INTEGRATED DEVICE STRUCTURES FOR NOISE ISOLATION AND LATCH UP IMMUNITY

(75) Inventors: Steven H. Voldman, South Burlington, VT (US); Robb A. Johnson, South Burlington, VT (US); Louis D. Lanzerotti, Burlington, VT (US); Stephen A. St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 09/752,061

(22) Filed: Dec. 29, 2000

(65) Prior Publication Data

US 2002/0084506 A1 Jul. 4, 2002

(51) Int. Cl.[7] .................. H01L 29/76; H01L 29/94; H01L 31/062
(52) U.S. Cl. .................. 257/370; 257/350; 257/374; 257/378; 257/396; 257/511; 257/525
(58) Field of Search ................. 257/350, 370, 257/374, 378, 396, 397, 511, 525

(56) References Cited

U.S. PATENT DOCUMENTS

| | | | |
|---|---|---|---|
| 4,908,328 A | | 3/1990 | Hu et al. |
| 4,935,800 A | | 6/1990 | Taguchi |
| 5,356,821 A | * | 10/1994 | Naruse et al. ......... 148/DIG. 9 |
| 5,405,790 A | | 4/1995 | Rahim et al. |
| 5,407,841 A | * | 4/1995 | Liao et al. ............ 148/DIG. 9 |
| 5,677,209 A | * | 10/1997 | Shon et al. .......... 148/DIG. 10 |
| 5,889,314 A | | 3/1999 | Hirabayashi |
| 5,939,753 A | | 8/1999 | Ma et al. |
| 5,970,333 A | | 10/1999 | Gris et al. |
| 5,994,755 A | | 11/1999 | DeJong et al. |
| 6,020,614 A | | 2/2000 | Worley |
| 6,313,000 B1 | * | 11/2001 | Kitch ....................... 438/309 |

* cited by examiner

Primary Examiner—Eddie Lee
Assistant Examiner—Matthew E. Warren
(74) Attorney, Agent, or Firm—Schmeiser, Olsen & Watts; Richard A. Henkler

(57) ABSTRACT

The preferred embodiment of the present invention provides a buried layer that improves the latch up immunity of digital devices while providing isolation structures that provide noise isolation for both the digital and analog devices. The buried layer of the preferred embodiment is formed to reside within or below the subcollector region in the transistor. Additionally, in the preferred embodiment the subcollector is isolated from buried layer outside the transistor region by deep isolation trenches formed at the edges of the subcollector. Additionally, an array of deep isolation trenches provides increased isolation between devices where needed. Thus, the preferred embodiment of the present invention provides an integrated circuit structure and method that provides improved latchup immunity while also providing improved noise tolerance.

14 Claims, 15 Drawing Sheets

DEEP TRENCH-BURIED LAYER ARRAY AND INTEGRATED DEVICE STRUCTURES FOR NOISE ISOLATION AND LATCH UP IMMUNITY

BACKGROUND OF THE INVENTION

1. Technical Field

The present invention relates generally to the field of semiconductor manufacturing and, more specifically, to a method for forming integrated circuit devices that improves latchup tolerance while also providing improved noise isolation.

2. Background Art

The need to remain cost and performance competitive in the production of semiconductor devices has caused continually increasing device density and device performance in integrated circuits. To facilitate the increase in device density, new technologies are constantly needed to allow the feature size of these semiconductor devices to be reduced while increasing the performance of the devices.

The push for ever increasing performance is particularly strong in electronic devices where digital and analog components are formed and must operate together without interference. Unfortunately, there are conflicting design goals that come into play when both analog and digital devices are formed together.

For example, one important issue in analog devices is noise. Noise can determinately effect analog devices in a myriad of ways. As such, it is generally preferable to form these analog devices in way that minimizes the impact of noise on those devices. For example, in bipolar junction transistor technology it is generally preferable to form the devices on p– wafer to maximize the noise tolerance of the devices. While this design choice improves the noise tolerance of the analog bipolar transistors, it has detrimental effects on the digital portions of device.

In particular, using a p– wafer reduces the latchup tolerance of the BiCMOS, CMOS and other elements of the digital devices. Latchup is a well known problem caused by unwanted transistor action between elements of the integrated circuit. This unwanted transistor action can be triggered by a wide variety of events, and can cause the semiconductor device to fail. Latch-up is generally caused by the close proximity of n-channel and p-channel devices in modern CMOS devices.

Thus, for digital devices, it is generally preferable to use a p+ wafer or a p+ buried layer to improve the latchup tolerance of the devices. While a p+ buried layer will serve to increase latchup tolerance, it will also negatively effect the noise tolerance of the bipolar transistors used in the analog devices. Additionally, when buried layers are formed through bipolar transistors, the resulting transistors suffer from increased subcollector-to-substrate capacitance. This limits the operational frequency of the bipolar transistor.

Designers of mixed analog and digital devices have thus been forced to choose between improving noise tolerance or latchup tolerance. Thus, there is currently no effective way to maximize the noise tolerance of analog devices while also maximizing the latchup tolerance of digital devices in mixed analog/digital environments. Without an improved method and structure for forming mixed analog/digital devices, the performance reliability of these devices will continue to be compromised.

DISCLOSURE OF INVENTION

Accordingly, the present invention provides a unique device structure and method that provides increased noise tolerance and latchup immunity in integrated circuit devices. The preferred embodiment of the present invention provides a buried layer that improves the latch up immunity of digital devices while providing isolation structures that provide noise isolation for both the digital and analog devices. The buried layer of the preferred embodiment is formed to reside within or below the subcollector region in the transistor. When formed within the buried layer doping is overwhelmed by the subcollector doping in the transistor region. Additionally, in the preferred embodiment the subcollector is isolated from buried layer outside the transistor region by deep isolation trenches formed at the edges of the subcollector. By forming the buried layer within the subcollector in the transistor region and forming deep isolation trenches at the edges of the subcollector, subcollector leakage, capacitance and noise transmission that would otherwise result from the buried layer is reduced. In an additional embodiment, an array of deep isolation trenches provides increased isolation between devices where needed. Thus, the preferred embodiment of the present invention provides an integrated circuit structure and method that provides improved latchup immunity while also providing improved noise tolerance.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The present invention provides a unique device structure and method that provides increased noise tolerance and latchup immunity in integrated circuit devices. The preferred embodiment of the present invention provides a buried layer that improves the latch up immunity of digital devices while providing isolation structures that provide noise isolation for both the digital and analog devices. The buried layer of the preferred embodiment is formed to reside within the subcollector region in the transistor. As such, the buried layer doping is overwhelmed by the subcollector doping in the transistor region. Additionally, in the preferred embodiment the subcollector is isolated from buried layer outside the transistor region by deep isolation trenches formed at the edges of the subcollector. By forming the buried layer within the subcollector in the transistor region and forming deep isolation trenches at the edges of the subcollector, subcollector leakage, capacitance and noise transmission that would otherwise result from the buried layer is reduced. In an additional embodiment, an array of deep isolation trenches provides increased isolation between devices where needed. Thus, the preferred embodiment of the present invention provides an integrated circuit structure and method that provides improved latchup immunity while also providing improved noise tolerance.

Figure 1:
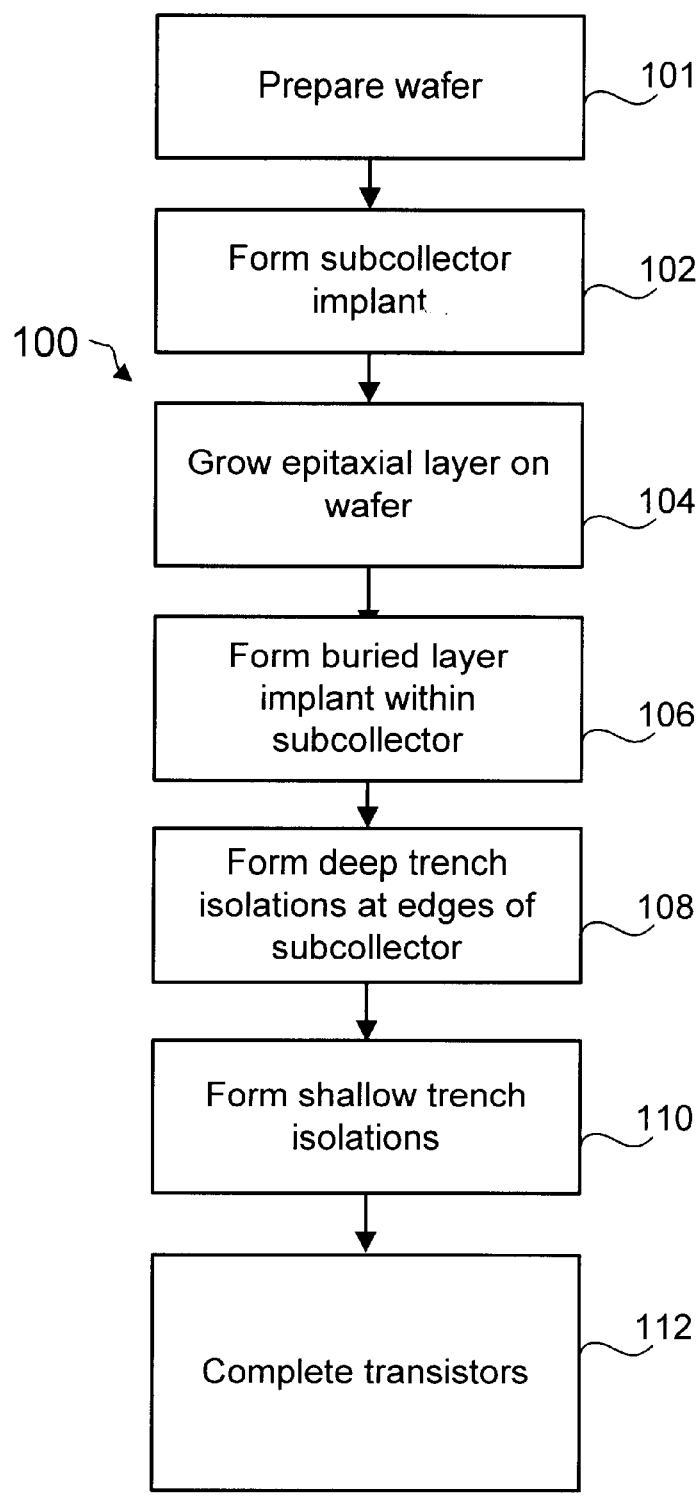
FIG. 1 is a flow diagram illustrating a preferred method in accordance with the present invention.

Turning now to FIG. 1, a method 100 for forming an integrated circuit in accordance is illustrated. In the preferred embodiment, the fabrication process is one that provides for both analog and digital devices to be formed on a single wafer. For example, a BiCMOS process that can form bipolar transistors and field effect transistors can be used. Such a process can be used to provide both the high performance available from bipolar transistors and the low power consumption available from field effect transistors on a single integrated device.

As will be explained in greater detail later, in the most preferred embodiment silicon germanium (SiGe) heterojunction bipolar transistors (HBTs) are formed to provide high speed analog processing. Of course, other bipolar transistor technology can be used, including bipolar junction transistors. Likewise, digital processing is preferably provided by compatible VLSI CMOS circuits. Thus, the result is a single chip solution that utilizes SiGe BiCMOS to provide high speed analog and digital devices. The preferred process can be used to form devices used in a wide range of applications, including high speed wireless communication.

It should also be noted that while the preferred embodiment method 100 will be described with reference to the fabrication and use with a bipolar NPN transistor, that the structure can be used with other BiCMOS passive and active elements. For example, it can be used in conjunction with a varactor, a p-i-n diode, a Schottky diode, and/or an isolated FET. Furthermore, it can be used with various different kinds of transistor designs, such as homojunction bipolar transistors, SiGe heterojunction transistors, and/or SiGeC transistors. In those cases, the method will vary from method 100 in ways appropriate to the device formed.

The first step of method 101 is to prepare the wafer. This suitably involves providing a p type, single crystal silicon wafer, followed by processing to remove surface defects. In the preferred embodiment, the wafer comprises a lightly doped, high resistivity, p- substrate. Such a substrate provides for low noise transmission, and thus improves the noise tolerance and performance of the resulting bipolar transistors.

The next step 102 is to form a subcollector implant in the wafer. This preferably comprises forming a highly n+ doped implant at the surface of the wafer in areas where bipolar devices are to be formed. In particular, the preferred process is as follows: A subcollector (NZ) mask is placed on the surface of the wafer. The mask is then selectively removed to open a central region for the subcollector implant. A high dose implant is done, preferably a n+ dopant, to form a subcollector region.

Figure 2:
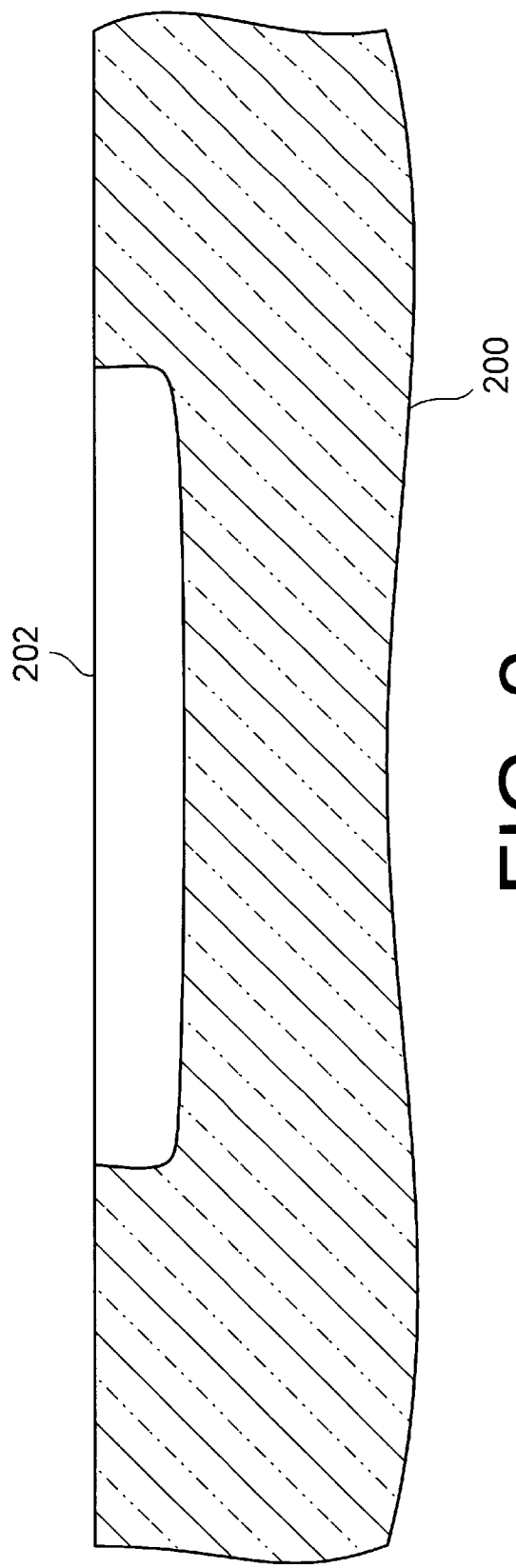
FIGS. 2–14 are schematic cross sections illustrating a first embodiment of the present invention.

Turning to FIG. 2, a wafer portion 200 is illustrated after the formation of a subcollector implant 202. Again, wafer portion 200 preferably comprises a lightly doped p- wafer, and subcollector implant 202 preferably comprises a highly doped, n+ implant.

Returning to FIG. 1, the next step 104 is to grow a epitaxial layer over the surface of the wafer. Preferably the epitaxial layer as formed comprises a 1–4 micron thick lightly doped layer. Because the epitaxial process is a hot process, the subcollector implant diffuses into the epitaxial layer and further diffuses into the substrate.

Figure 3:
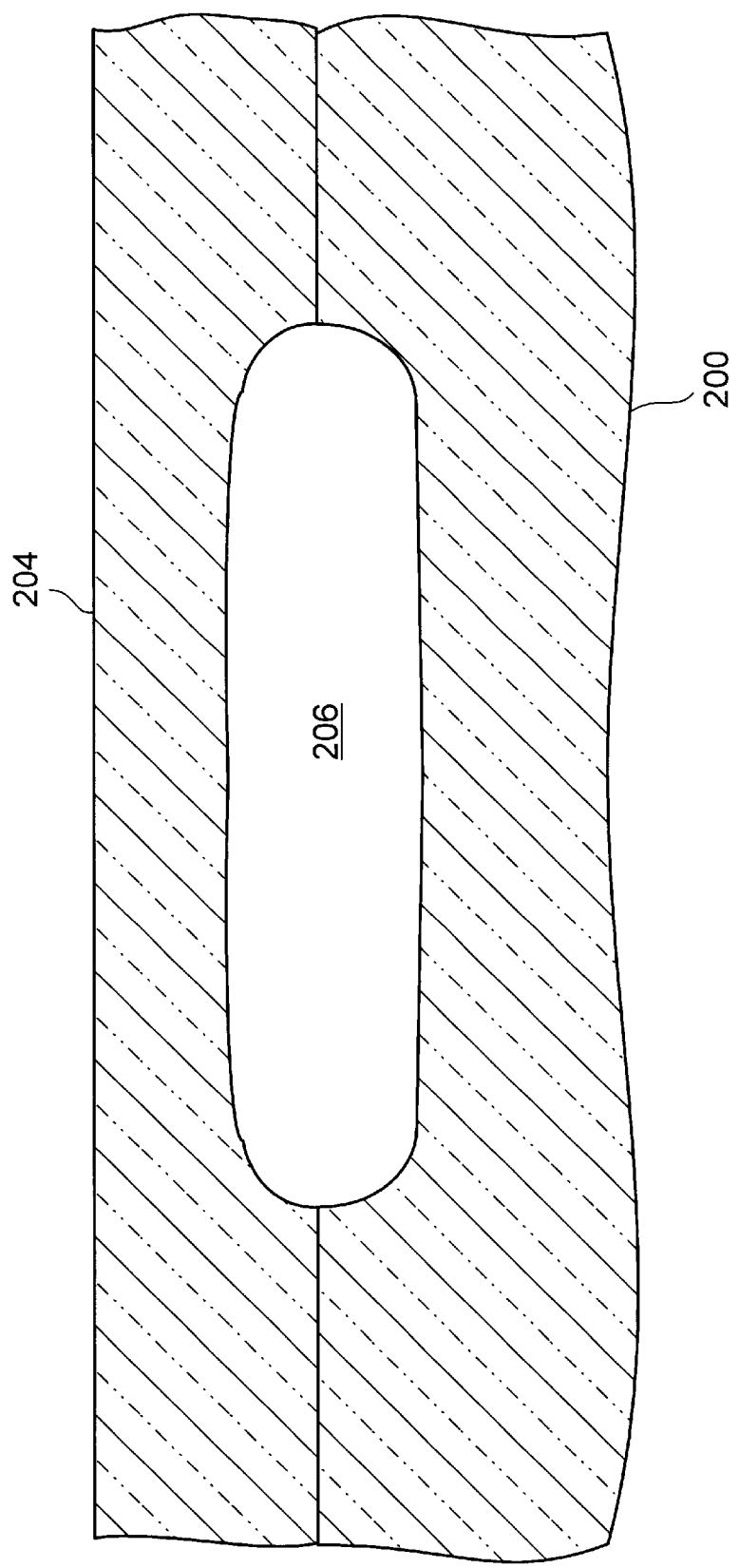

Turning now to FIG. 3, the wafer portion 200 is illustrated after the formation of an epitaxial layer 204. The process of forming the epitaxial layer 204 has likewise caused the subcollector implant 202 to diffuse, forming the subcollector 206.

Returning to FIG. 1, the next step 106 is to form a buried layer "within" or "below" the subcollector. In the preferred embodiment, the buried layer comprises a p+ buried layer that is implanted across the surface of the wafer. As discussed above, the main purpose of the buried layer is to provide a low resistivity shunt across the wafer. This reduces the likelihood of latchup in the in the devices, in particular in the digital CMOS transistors formed on other portions of the wafer.

The buried layer implant is preferably formed "within" the subcollector implant. In particular, the buried layer implant is formed at a depth such that the resulting buried layer resides at least primarily between the upper and lower reaches of the subcollector. In the preferred embodiment, the p+ buried layer implant is an implant having significant less doping concentration than the previously made n+ subcollector implant. For example, the n+ subcollector can be suitably implanted to an order or magnitude higher than the implant doping concentration of the buried layer. With the subcollector having significantly greater doping concentration than the buried layer, the buried layer implant is effectively compensated out in the areas where it passes through the subcollector. Thus, the existence of the buried layer in the proximity of the bipolar transistor will not significantly impact the performance of the bipolar transistor. In particular, it will not increase susceptibility to noise or increase subcollector-to-substrate capacitance. However, because the buried layer implant is not compensated out in other areas, it can serve as a low resistence shunt to reduce latchup propensity in the CMOS areas of the wafer.

Figure 4:
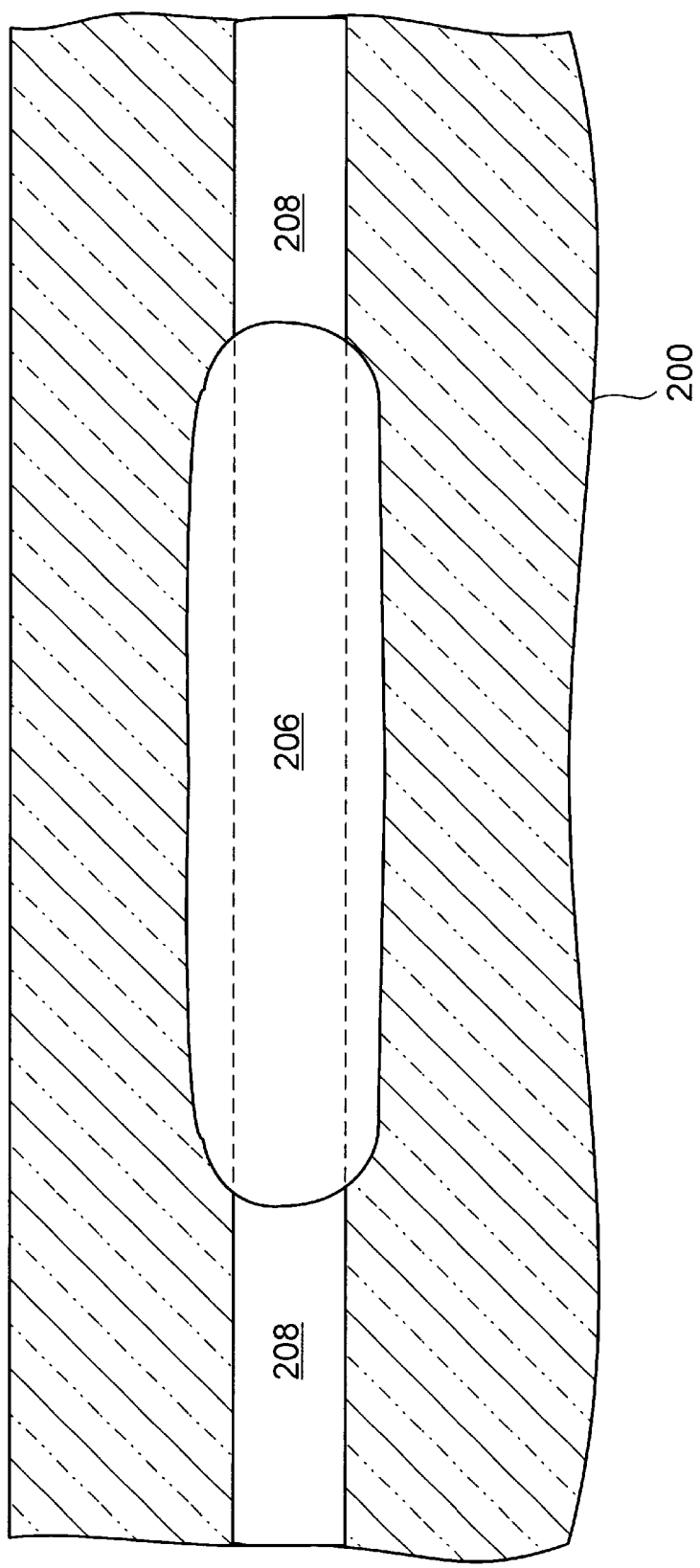

Turning now to FIG. 4, the wafer portion 200 is illustrated after the formation of the buried layer 208. In FIG. 4, the area in which the buried layer 208 is implanted into the subcollector 206 is illustrated with dashed lines. In accordance with the preferred embodiment, the buried layer implant is formed at a depth such that the resulting implant layer is formed "within" the subcollector 206. In particular, the buried layer 208 resides at least primarily between the upper and lower boundaries subcollector 206. Again, this allows the higher n+ doping concentration of the subcollector 208 to cancel out the p+ doping concentration of the buried layer in bipolar transistor regions, while still providing the advantages of the p+ buried layer in other areas of the wafer.

At this point, it should be noted that the steps above can be performed in several different variations. For example, the buried layer can be implanted before the formation of the epitaxial layer on the wafer. In this embodiment, the buried layer would be first implanted at the surface of the wafer, and then the epitaxial process performed, causing the buried layer implant to diffuse in the same way the collector implant does. This method would generally be preferable in situations where the high energy implant needed to deeply implant the wafer is undesirable or impractical.

In another variation, both the subcollector and buried layer could be formed by high energy implantation after the formation of the epitaxial layer, or directly into the wafer when an epitaxial layer is not used. In another variation, either the subcollector and/or the buried layer is formed after the formation of the deep trench isolations, which we be described next.

In another embodiment, the buried layer is formed below the subcollector instead of within the subcollector. In particular, in the this embodiment, the buried layer is preferably formed below the subcollector to avoid increasing subcollector-to-substrate capacitance. However, care must be taken to insure that the buried layer in this embodiment does not extend below the depth of the deep trench isolation.

The buried layer must still be formed such that it is "broken up" by the deep trench isolation, otherwise the buried layer would transfer noise to the analog portions of the device.

In this embodiment, it is not necessary that the buried layer doping concentration be less than the doping concentration of the subcollector, because the subcollector is not being used to compensate for the buried layer doping.

In this embodiment, the buried layer can be formed at this deeper depth throughout the wafer, in both the analog and digital portions of the device. However, in some cases it is desirable to have the buried layer formed at a shallower depth in the digital CMOS portions than it is formed in the analog BiCMOS portions. For example, it is generally preferable that the buried layer be implanted directly below the well regions on the CMOS side to best prevent device latchup. There are several methods that could be used to form the buried layer deeper in BiCMOS portions than in CMOS portions of the same device. For example, a masking layer of appropriate thickness can be deposited over the CMOS portions of the wafer. This masking layer adds thickness in those regions, and a blanket implant would thus result in shallower implants in those regions where the masking layer exists. Thus, the resulting buried layer could be formed at an optimal shallower depth in the CMOS portions, and a optimal deeper depth in the BiCMOS portions. The masking layer used to achieve this buried layer design would generally not need to be as thick as a total blocking masking layer, and thus would not suffer the disadvantages described above.

The buried layer can also be formed at a depth such that it is partially within the subcollector, and extends below the subcollector. This design can improve ESD robustness of the subcollector to substrate diode, and lower the subcollector breakdown voltage. However, this would increase design increase subcollector-to-substrate capacitance, which can be undesirable.

A final variation uses a masking layer to selective adjust the depth of the buried layer in the bipolar transistor regions. In particular, the masking layer is used to insure that the buried layer is within the subcollector in bipolar areas, but is at another depth in other areas.

Returning to FIG. 1, the next step 108 is to form a deep trench isolation around the edges of the subcollector. In the preferred embodiment, the deep trench isolations are formed deep enough to extending through the buried layer and subcollector. The preferred process for forming deep isolation trenches is as follows. First, a deep trench (DT) resist is deposited and selectively removed to form a mask for etching a pair of deep trenches in the epitaxial layer and wafer substrate. Etching is then done by reactive ion etching (RIE) or other suitable technique to form the deep trenches in the substrate. A channel stop is then implanted across the wafer, forming an implant at the bottom of the trench. An isolation film is then deposited thereover to form an oxide dielectric in the trench. The remaining portions of the deep trench are then filled with polysilicon. It should be noted that in the preferred embodiment, this is the same process used to form deep trench capacitors in other areas of the wafer as needed. The deep trench isolation is formed at a depth to penetrate through the buried layer to create up and down resistance in the region.

The deep trench isolations serve to isolate the n+ subcollector from the portions p+ buried layer not canceled by the subcollector implant. Otherwise, the PN junction formed at the subcollector/buried layer interface would create subcollector leakage and increase subcollector-to-substrate capacitance that would otherwise interfere with high frequency operation of the bipolar transistors.

Figure 5:
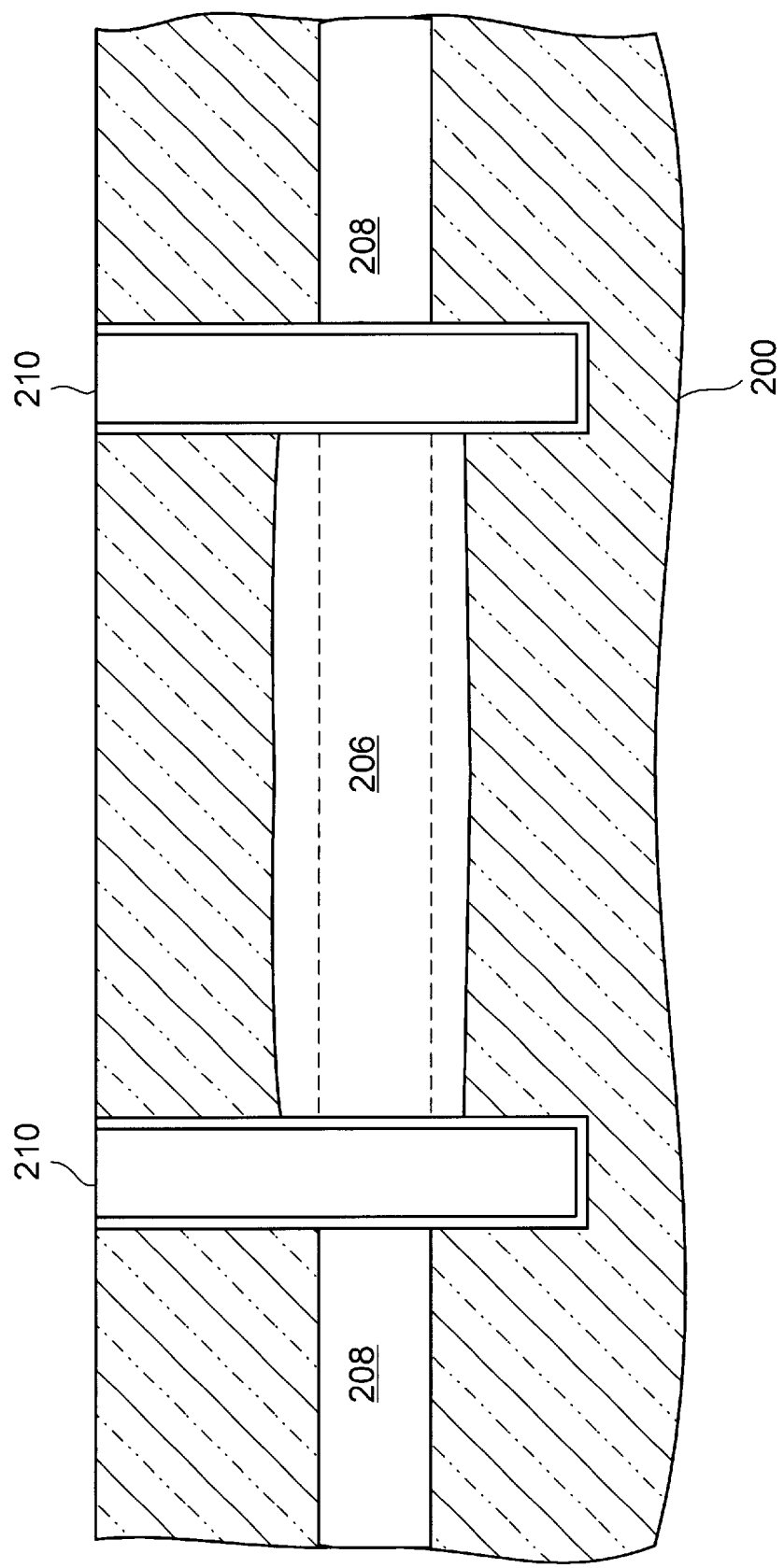

Turning now to FIG. 5, the wafer portion 200 is illustrated after the formation of deep trench isolation 210. The deep trench isolation 210 is formed at the edges of the subcollector 206 an extends through the subcollector 206 and the buried layer 208. The preferred embodiment deep trench isolation 210 is lined with oxide and then filled with polysilicon. Thus formed, the deep trench isolation 210 serves to isolate the subcollector 206 from the buried layer 208.

It should be noted that the formation of the buried layer within the depth of the subcollector, and the formation of the deep trench isolation, allows the buried layer to be formed with a blanket implant across the wafer. That is, the buried layer implant can be performed in both the CMOS and bipolar areas of the wafer, without negatively impacting the performance of the bipolar transistors. This is significant because the high energy needed to implant the buried layer is difficult to use with commonly used resists. In particular, to perform a selective implant to form the buried layer in only selective areas, a resist would need to be deposited to selectively block the buried layer implant. The high energy of the buried layer implant can cause the resist to harden and shrink, making the resist difficult to remove. The preferred embodiment eliminates this problem by allowing for a blanket implant to be used to form a buried layer throughout the wafer, while still providing high performance bipolar transistors.

While FIG. 5 illustrates the wafer portion 200 with a single deep trench isolation around the subcollector, the preferred embodiments of the present invention can also use an array of deep trench isolations to provide further isolation. Generally, an array of deep trench isolations will be used when increased isolation between devices is desired. For example, arrays of deep trench isolations can be used to isolate bipolar transistors from digital CMOS transistors that are in close proximity. As such, an array of deep trench isolations will provide increased isolation created by he digital circuits, and will thus increase the performance of analog bipolar devices.

Returning to FIG. 1, the next step 10 is to form shallow trench isolations in non-active area regions of the wafer. Additionally, a shallow trench isolation region is preferably formed to separate the NPN area of the bipolar transistor from the reach through contact area. This is preferably done by etching shallow trenches in selective areas, filling those trenches with suitable dielectrics, and planarizing the top surface of the shallow trench isolations and the wafer. Again, the shallow trench isolations are formed in both the bipolar and CMOS areas of the wafer.

Figure 6:
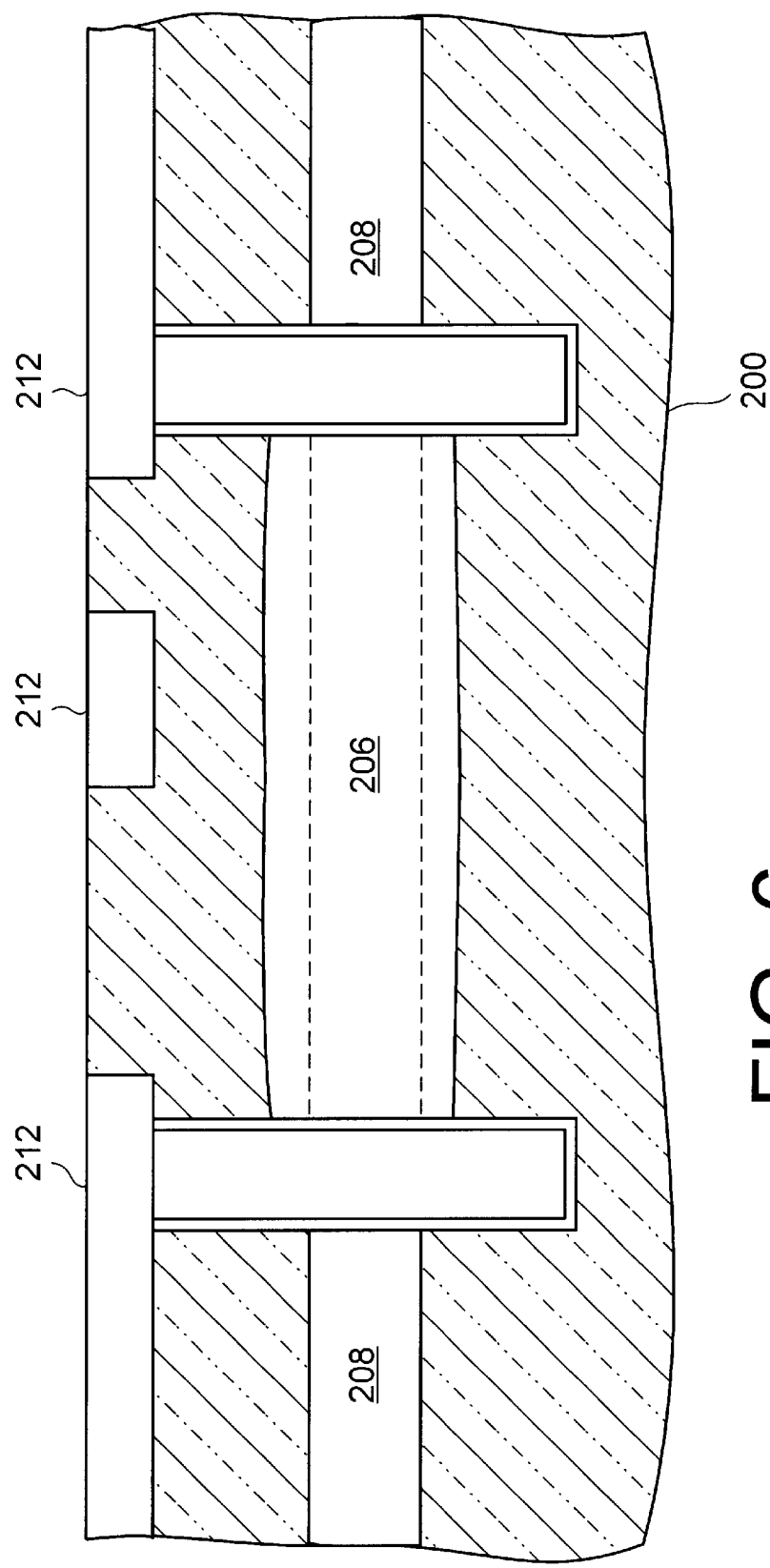

Turning now to FIG. 6, the wafer portion 200 is illustrated after the formation of shallow trench isolation regions 212. Shallow trench isolation regions 212 have been formed in the non-active areas, as well as between the NPN area of the bipolar transistor and the reach through contact area.

Returning to FIG. 1, with the shallow trench isolations formed, the next step is to complete the bipolar transistors in any suitable manner. Preferably, the CMOS devices on other portions of the wafer are also completed at the same time.

Typically, this would involve first forming a reach through contact to the collector of the bipolar transistor. This is preferably done by selectively depositing a reach through implant resist (RN), leaving openings over the reach through region between the shallow trench isolation regions. A reach through implant is then performed using ion implantation across the wafer. The RN resist is then stripped.

An NPN protective nitride is then deposited over the surface of the wafer, and a protect nitride resist (PX) is deposited and selectively removed, except over the NPN area and a portion of the adjacent shallow trench isolation. The protective nitride is then stripped, except where protected by the PX resist.

An N-well (NW) mask and resist is then formed uniformly on the wafer and patterned. N-well implants are then performed. This forms the N-well regions for the CMOS devices on other portions of the wafer. The NW mask is then stripped. A DN mask is then applied followed by a DN resist and removal of the DN mask. PMOS channel implants are then implanted into the well area for the p-channel CMOS devices.

Next, to for the p-well implants for the CMOS devices, a BF mask is applied and resist formed. P-well implants are then made in CMOS area for the NFET areas. The BF mask is then removed.

Next a FET protective oxide layer is applied followed by a polysilicon protective layer and oxide layers. A resist layer (BX) is then deposited and patterned to reveal the NPN area of the bipolar transistors. A deep pedestal n implant is then performed followed by etching of the PX nitride to form separate nitride pads over the shallow trench isolations adjacent to the NPN area. The deep pedestal implant is formed in the collector region to improve the frequency response of the transistor.

Figure 7:
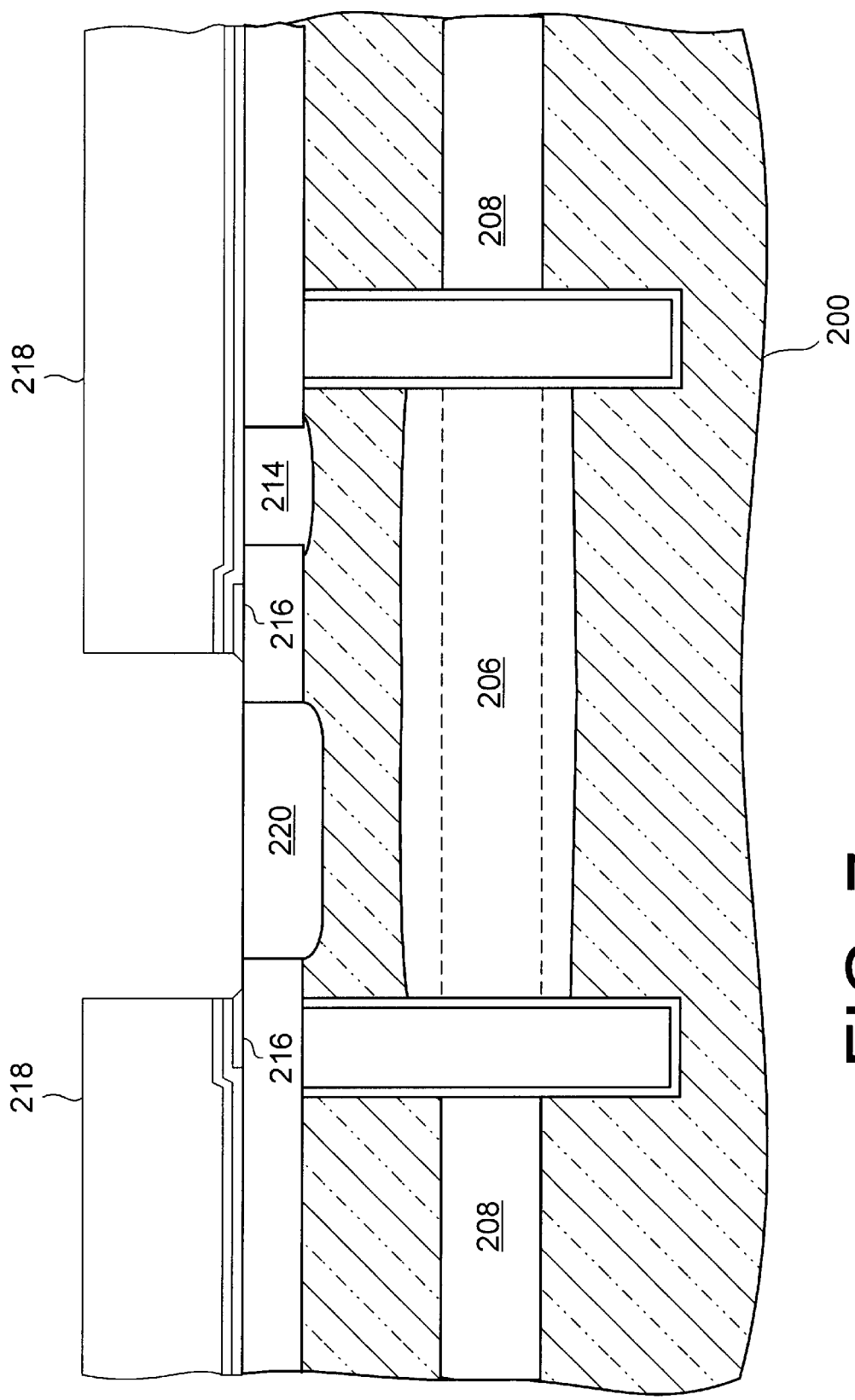

Turning now to FIG. 7, the wafer portion 200 is illustrated after formation of reach through contact implants 214, the depositing and patterning of the NPN protective nitride, the deposition of protective layers, the deposition and patterning of resist layer 218, and the formation of the deep pedestal n implant 220 through the opening in the resist layer 218, and the removal of exposed portions of the NPN protective nitride to complete nitride pads 216.

Figure 8:
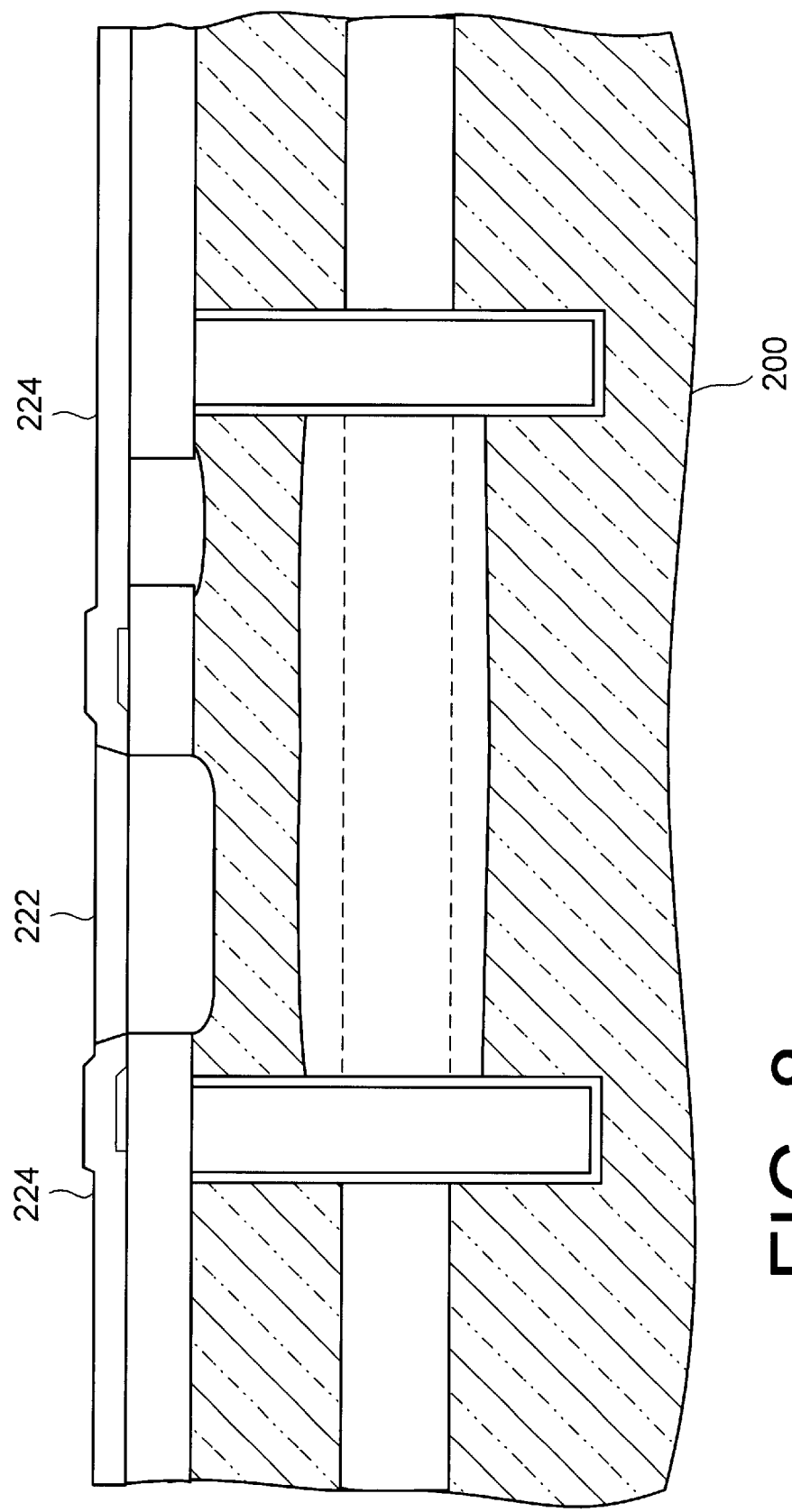

Next, the BX resist layer and protective layers are removed, and a low temperature epitaxial (LTE) film growth of Si/SiGe is performed. This forms a single crystal SiGe film layer in the area directly over the exposed NPN region, and a polycrystalline or amorphous film layer in the adjacent portions directly over the shallow trench isolation. These will be used to form the base of the bipolar transistor. Turning now to FIG. 8, the wafer portion 200 is illustrated after a film growth of Si/SiGe is performed that forms a single crystal SiGe film 222 over the NPN region, and polycrystalline film 224 over the shallow trench isolation regions.

Figure 9:
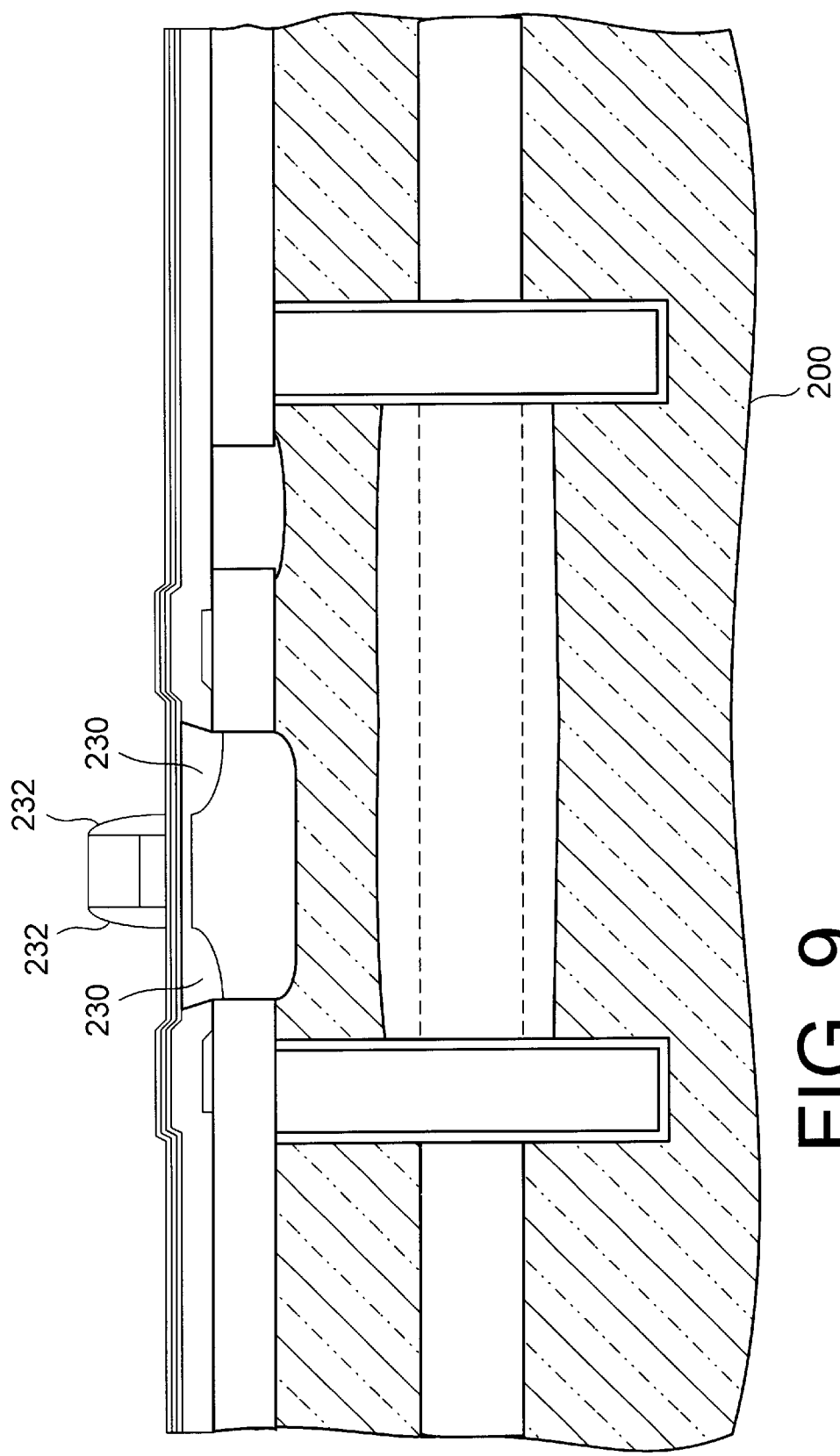

Next, an oxide layer is then grown followed by a nitride layer a second oxide layer. Next, the emitter films are grown or deposited. To define the emitter and the extrinsic base, an emitter mask (EN) and resist layer are applied followed by a stripping of the EN resist. Oxide and nitride layers are etched to define the emitter region followed by stripping of the EN resist and forming oxide over and alongside emitter. Then, to implant the extrinsic base, a spacer deposit is made and etched to define the spacing between the base and the emitter. The base is then implanted with p+ dopants. The result is illustrated in FIG. 9, where the wafer portion 200 is illustrated showing the base implanted with p+ dopants 230 using oxide sidewall spacers 232 to define the spacing between the base and the emitter.

Figure 10:
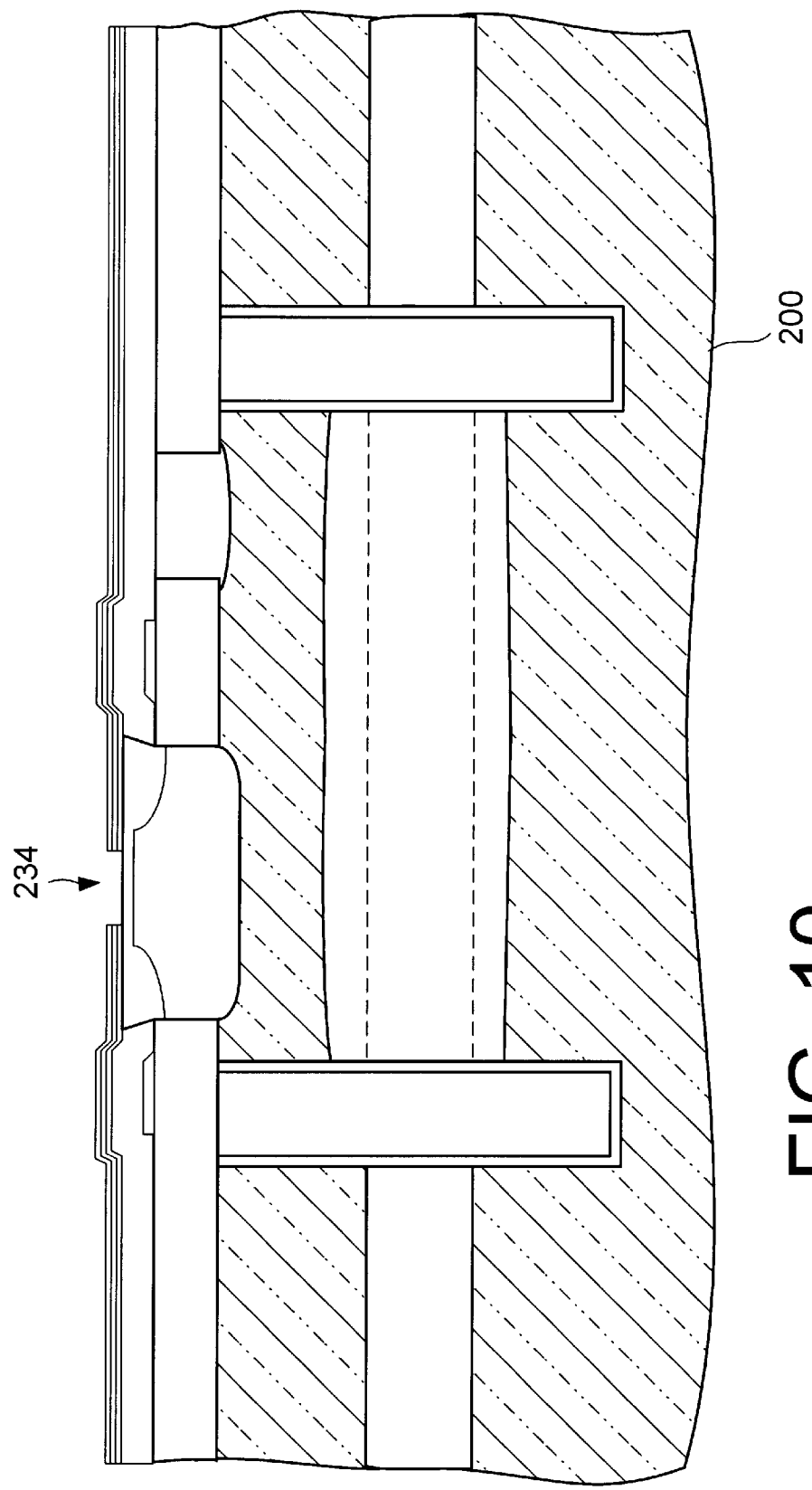

Next, the oxide spacers are removed and there is performed a high pressure oxidation polysilicon conversion to oxide followed by an oxide etch and removal of the emitter window in the protective oxide/nitride/oxide films. The result of this step is illustrated in FIG. 10, where wafer portion 200 is illustrated after an emitter window 234 has been opened in the oxide/nitride/oxide layers.

Figure 11:
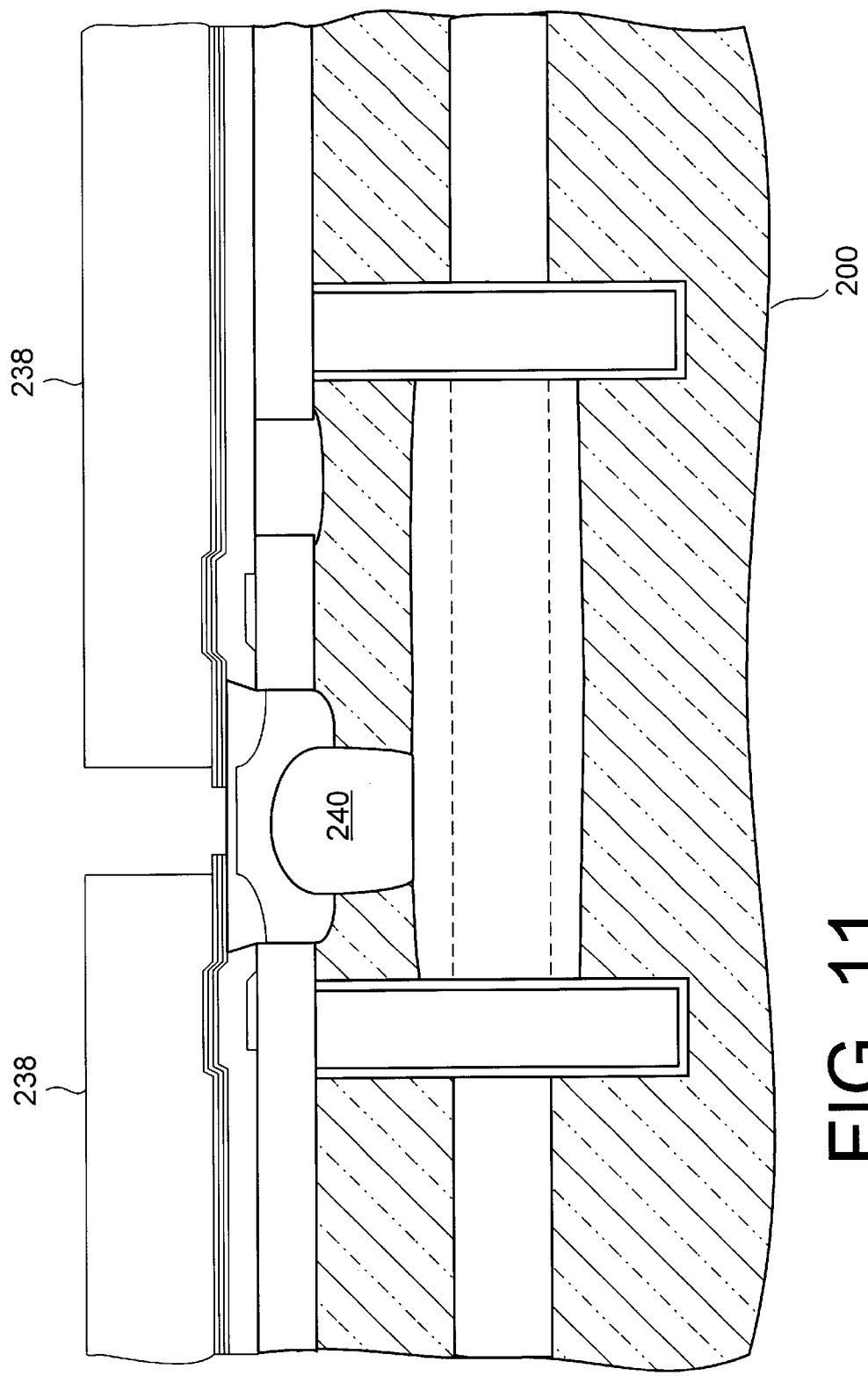

Then a pedestal implant is performed. First, a mask N2 and resist layer is defined to expose the emitter area and an n+ implant of is made to form the pedestal implant. Turning to FIG. 11, the wafer portion 200 is illustrated after the deposition and patterning of a resist layer 238, and the implantation of a pedestal 240.

Figure 12:
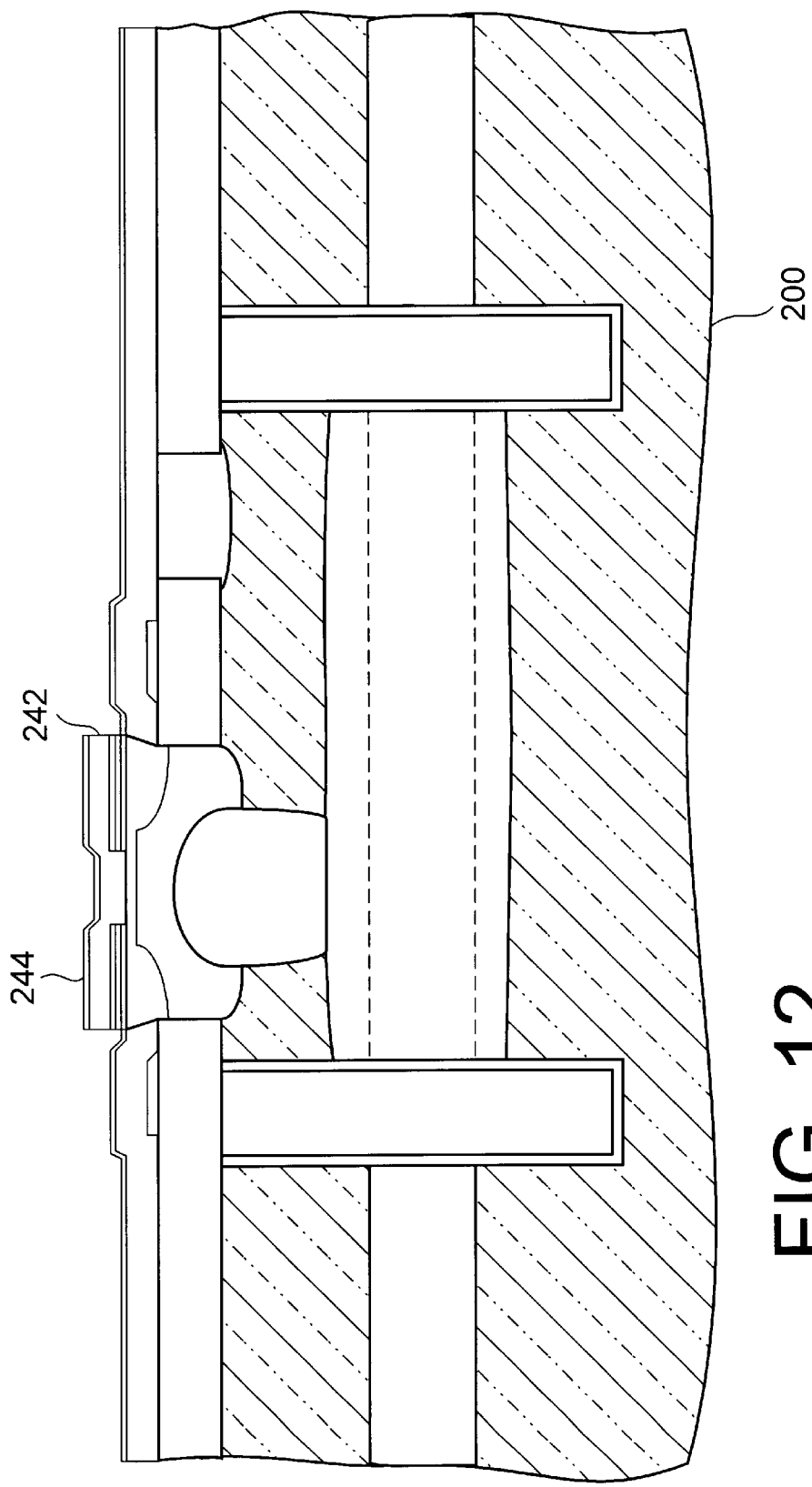

Next, a polysilicon film is made in the emitter area followed by n+ doping of the polysilicon film to form the emitter, and the formation of a polysilicon cap of the film. A resist is then deposited and patterned to define the emitter. Turning FIG. 12, the wafer portion 200 is illustrated after the deposition of polysilicon film 242, implantation, the deposition of polysilicon cap 244, and the patterning of film 242 and cap 244 to form the emitter.

Figure 13:
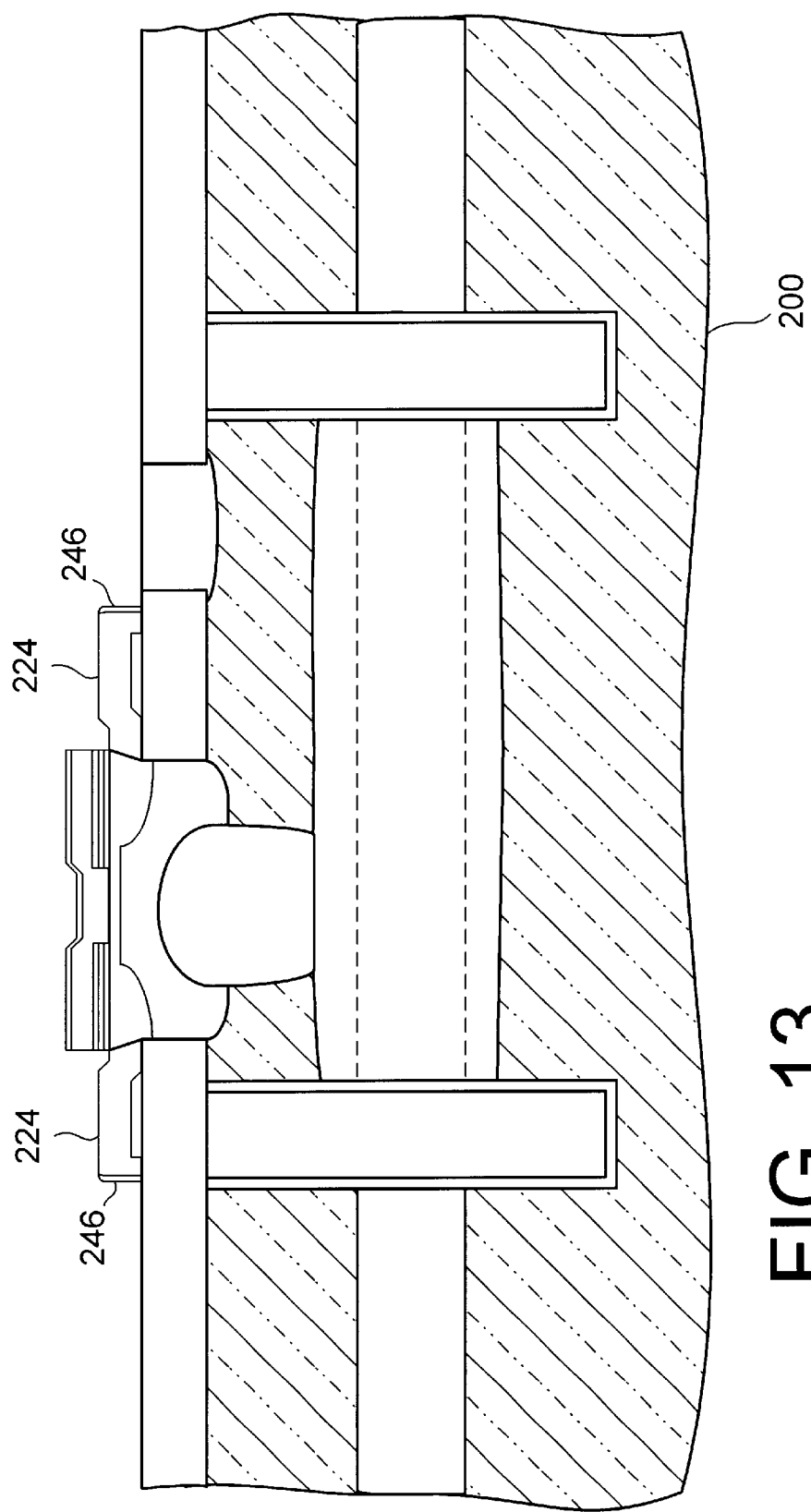

Next, resist is applied and patterned to define the transistor base. The SiGe base layer is then etched to define the transistor base. A nitride cap is then deposited on the sidewalls of the defined base. Turning to FIG. 13, the wafer portion 200 is illustrated after the SiGe base layer 224 has been patterned to define the base, and nitride caps 246 have been formed on the sidewalls of the base.

Next, a BN mask and resist is applied over the entire surface, and the p-channel MOSFET source/drain implant is performed on the CMOS devices. The resist is then removed.

Figure 14:
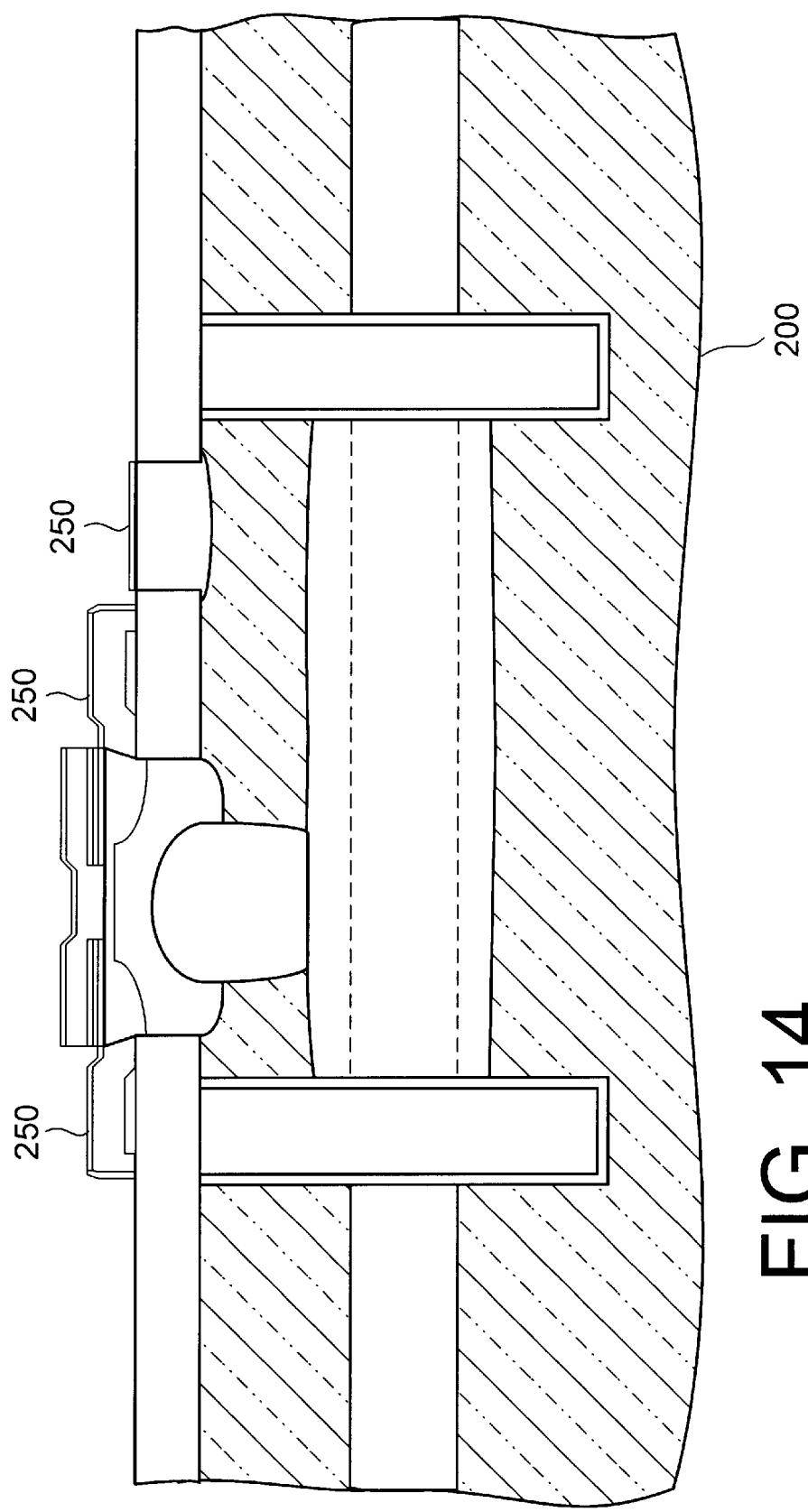

Next, there is deposited titanium silicide with the self aligned silicide forming on the exposed p+ polysilicon regions. Subsequently, the silicide cap TiSix formation is performed. Turning to FIG. 14, the wafer portion 200 is illustrated after the formation of TiSix silicide cap 250.

With the devices completed to this point, standard back end of line processing can be used to form the connections between devices. Thus, the preferred embodiment of the present invention provides a unique device structure and method that results increased noise tolerance and latchup immunity in integrated circuit devices.

Another feature of the preferred embodiment to the present invention is the selective use of deep trench isolation arrays. Arrays of deep isolation trenches further facilitate the use of buried layers by further negating the negative effects those buried layers can have the analog, bipolar portions of the devices. Generally, it is preferable to use an array of deep trench isolations in areas where increased isolation between devices is desired. For example, arrays of deep trench isolations can be used to isolate bipolar transistors from digital CMOS transistors that are in close proximity. As such, an array of deep trench isolations will provide increased isolation created by he digital circuits, and will thus increase the performance of analog bipolar devices.

Typically it will be desirable to isolate all bipolar devices from the CMOS devices. This can be done by grouping the bipolar and CMOS devices into separate areas, and then forming an array of deep trench isolations between groups. For example, a ring of deep trench isolations can be formed around each group of bipolar devices. This solution has the advantage of providing protection from CMOS induced noise to all the bipolar devices while conserving area dedicated to isolation structures.

Figure 15:
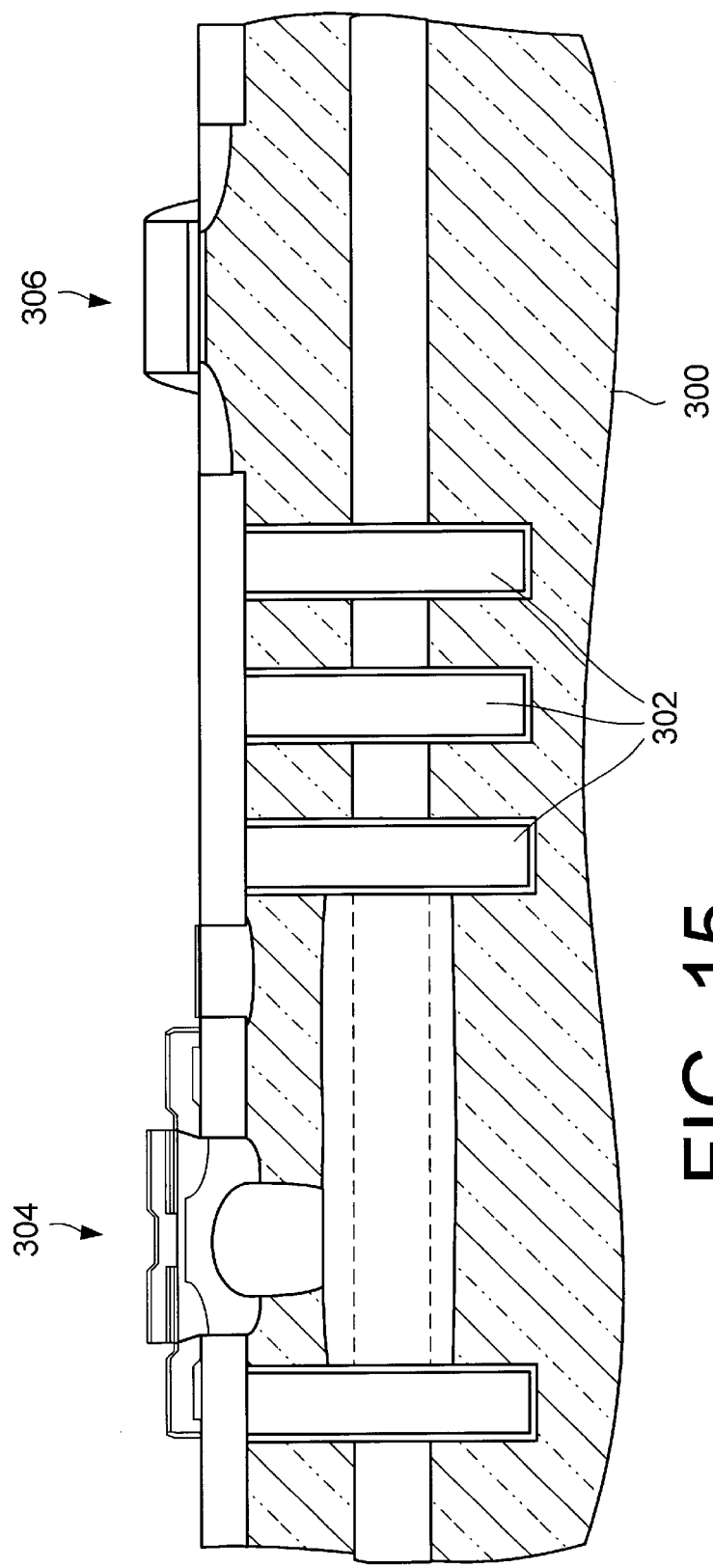
FIG. 15 is schematic cross sections illustrating a second embodiment of the present invention.

Turning to FIG. 15, a wafer portion 300 that uses an array of deep trench isolations 302 is illustrated. The array of deep trench isolations serves to isolate the analog devices (as represented by bipolar transistor 304) from the digital devices (as represented by the CMOS FET 306). The array of deep trench isolations 302 comprises three deep trench isolations formed proximate one another. Each of the deep trench isolations in the array is preferably formed using the method described above with reference to step 108 and FIG. 5. Again, a key feature of the deep trenches used in the array is that they extend below the depth of the buried layer, where the buried layer crosses the trench. Thus formed, the deep trenches serve to disrupt the noise transmitting properties of the buried layer. While the illustrated array of deep trench isolations 302 includes three adjacent isolations, it should be noted that such an array could include as few as two adjacent isolations or could include a greater number of deep trench isolations.

Generally, each additional deep trench isolation formed in the array increases the physical resistance between the different sides of the array. Thus, the greater number of deep trench isolations formed, the greater the barrier provided by the array to the transmission of noise. The array of deep trench isolations further compensates and allows for the use of a buried layer across the surface of the wafer without negatively impacting the analog devices. It should also be noted that while FIG. 15 illustrates the array of deep trench isolations as adjacent to a subcollector, the preferred embodiment isolation arrays can be formed in other areas of the device. Again, it will generally be most beneficial to create the arrays in areas between analog and digital devices where noise transmission from the analog to the digital devices would otherwise be problem. However, array of isolation trenches can also be used within the CMOS area to isolate peripheral circuits from core circuits.

As an example embodiment, an array of 100 trenches can be formed to create 100 $\mu$m of isolation between the digital and analog areas where the trenches extend across the length of the chip in one dimension.

The preferred embodiment of the present invention thus provides a buried layer that improves the latch up immunity of digital devices while providing isolation structures that provide noise isolation for both the digital and analog devices. The buried layer of the preferred embodiment is formed to reside within the subcollector region in the transistor. As such, the buried layer doping is overwhelmed by the subcollector doping in the transistor region. Additionally, in the preferred embodiment the subcollector is isolated from buried layer outside the transistor region by deep isolation trenches formed at the edges of the subcollector. By forming the buried layer within the subcollector in the transistor region and forming deep isolation trenches at the edges of the subcollector, subcollector leakage, capacitance and noise transmission that would otherwise result from the buried layer is reduced. In an additional embodiment, an array of deep isolation trenches provides increased isolation between devices where needed. Thus, the preferred embodiment of the present invention provides an integrated circuit structure and method that provides improved latchup immunity while also providing improved noise tolerance.

While the invention has been particularly shown and described with reference to heterojunction bipolar transistors, those skilled in the art will recognized that the preferred methods can be used to form other types of transistors, and that various changes in form and details may be made therein without departing from the spirit and scope of the invention. For example, it can be used with other BiCMOS passive and active elements, such as other types of transistors, varactors, a p-i-n diode, a Schottky diode, and/or an isolated FET.

What is claimed is:

1. An integrated circuit device comprising
   a) a semiconductor substrate having a first portion in which analog devices are formed and a second portion in which digital devices are formed;
   b) a buried layer formed across the first and second portions of the semiconductor substrate;
   c) a trench isolation array, the trench isolation array comprising a plurality of adjacent trench isolations that extend through the buried layer,
   further comprising a subcollector, and wherein the buried layer is disposed within the subcollector in areas where the buried layer intersects the subcollector.

2. An integrated circuit comprising:
   a) a semiconductor substrate;
   b) a subcollector region of a first conductivity type formed in a first portion of the semiconductor substrate;
   c) a buried layer of a second conductivity type formed across said first portion and in adjacent portions of the semiconductor substrate in which digital devices are formed; and
   d) a trench isolation formed at edges of the subcollector, the trench isolation extending through the subcollector and the buried layer.

3. The integrated circuit of claim 2 wherein the buried layer comprises a blanket implant formed across the semiconductor substrate.

4. The integrated circuit of claim 2 wherein the subcollector comprises a n+ implant and wherein the buried layer implant comprises a p+ implant.

5. The integrated circuit of claim 2 wherein the buried layer is formed at a depth to intersect the subcollector in said first portion of the substrate.

6. The integrated circuit of claim 2 wherein the buried layer is formed at a depth below the subcollector.

7. The integrated circuit of claim 2 wherein the subcollector has a dopant dosage greater than ten times a dopant dosage of the buried layer.

8. The integrated circuit of claim 2 wherein the subcollector is part of a BiCMOS device.

9. The integrated circuit of claim 2 wherein the subcollector is part of a bipolar transistor.

10. The integrated circuit of claim 2 wherein the trench isolation comprises a plurality of adjacent trench isolations, with each of the adjacent trench isolations extending through the subcollector and the buried layer implant.

11. The integrated circuit of claim 2 wherein the subcollector is part of a SiGe transistor.

12. The integrated circuit of claim 2 wherein the subcollector is part of a SiGeC transistor.

13. The integrated circuit of claim 2 wherein the subcollector is part of a varactor, a p-i-n diode, or a Schottky diode.

14. The integrated circuit of claim 2 further comprising a p− epitaxial region formed above said subcollector, wherein the subcollector is formed as part of isolated FET formed within said p− epitaxial region.

* * * * *